US009837359B1

(12) United States Patent
Chiu et al.

(10) Patent No.: US 9,837,359 B1
(45) Date of Patent: Dec. 5, 2017

(54) INTEGRATED FAN-OUT PACKAGE AND METHOD OF FABRICATING THE SAME

(71) Applicant: Taiwan Semiconductor Manufacturing Co., Ltd., Hsinchu (TW)

(72) Inventors: Ming-Yen Chiu, Hsinchu County (TW); Ching-Fu Chang, Taipei (TW); Hsin-Chieh Huang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/281,081

(22) Filed: Sep. 30, 2016

(51) Int. Cl.
| | |
|---|---|
| H01L 21/56 | (2006.01) |
| H01L 23/538 | (2006.01) |
| H01L 23/31 | (2006.01) |
| H01L 21/48 | (2006.01) |
| H01L 25/10 | (2006.01) |
| H01L 25/00 | (2006.01) |

(52) U.S. Cl.
CPC ........ *H01L 23/5389* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/5383* (2013.01); *H01L 23/5384* (2013.01); *H01L 23/5386* (2013.01); *H01L 25/105* (2013.01); *H01L 25/50* (2013.01); *H01L 2225/1035* (2013.01); *H01L 2225/1041* (2013.01); *H01L 2225/1058* (2013.01)

(58) Field of Classification Search
CPC ............... H01L 23/5389; H01L 21/486; H01L 23/5384; H01L 25/50; H01L 25/105; H01L 21/565; H01L 21/4857; H01L 23/5383; H01L 21/4853; H01L 23/3114; H01L 23/5386
See application file for complete search history.

(56) References Cited

U.S. PATENT DOCUMENTS

| | | | | |
|---|---|---|---|---|
| 5,759,332 A | * | 6/1998 | Itoigawa | ................... G11B 7/26 156/273.5 |
| 8,294,276 B1 | * | 10/2012 | Kim | ...................... H01L 21/561 257/773 |
| 8,361,842 B2 | | 1/2013 | Yu et al. | |
| 8,647,966 B2 | * | 2/2014 | Lim | .................. H01L 23/49513 257/640 |
| 8,680,647 B2 | | 3/2014 | Yu et al. | |

(Continued)

*Primary Examiner* — Jarrett Stark
(74) *Attorney, Agent, or Firm* — JCIPRNET

(57) ABSTRACT

An integrated fan-out package including a die attach film, an integrated circuit component, an insulating encapsulation, and a redistribution circuit structure is provided. The integrated circuit component is disposed on the die attach film and includes a plurality of conductive terminals. The die attach film includes an uplifted edge which raises toward sidewalls of the integrated circuit component. The insulating encapsulation encapsulates the uplifted edge and the integrated circuit component. The redistribution circuit structure is disposed on the integrated circuit component and the insulating encapsulation, and the redistribution circuit structure is electrically connected to the conductive terminals of the integrated circuit component. A method of fabricating the integrated fan-out package are also provided.

6 Claims, 13 Drawing Sheets

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,318,429 B2 * | 4/2016 | Hu | H01L 23/49861 |
| 2009/0001599 A1 * | 1/2009 | Foong | H01L 25/0657 257/777 |
| 2009/0236718 A1 * | 9/2009 | Yang | H01L 25/03 257/686 |
| 2011/0291288 A1 | 12/2011 | Wu et al. | |
| 2012/0056312 A1 * | 3/2012 | Pagaila | H01L 21/561 257/684 |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2016/0163564 A1 * | 6/2016 | Yu | H01L 24/83 257/774 |
| 2016/0163578 A1 * | 6/2016 | Yu | H01L 23/5384 257/738 |
| 2016/0307862 A1 * | 10/2016 | Lin | H01L 25/0657 |
| 2017/0098589 A1 * | 4/2017 | Liu | H01L 23/544 |

\* cited by examiner

INTEGRATED FAN-OUT PACKAGE AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. The improved routability and reliability provided by the integrated fan-out packages are key factors for future packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
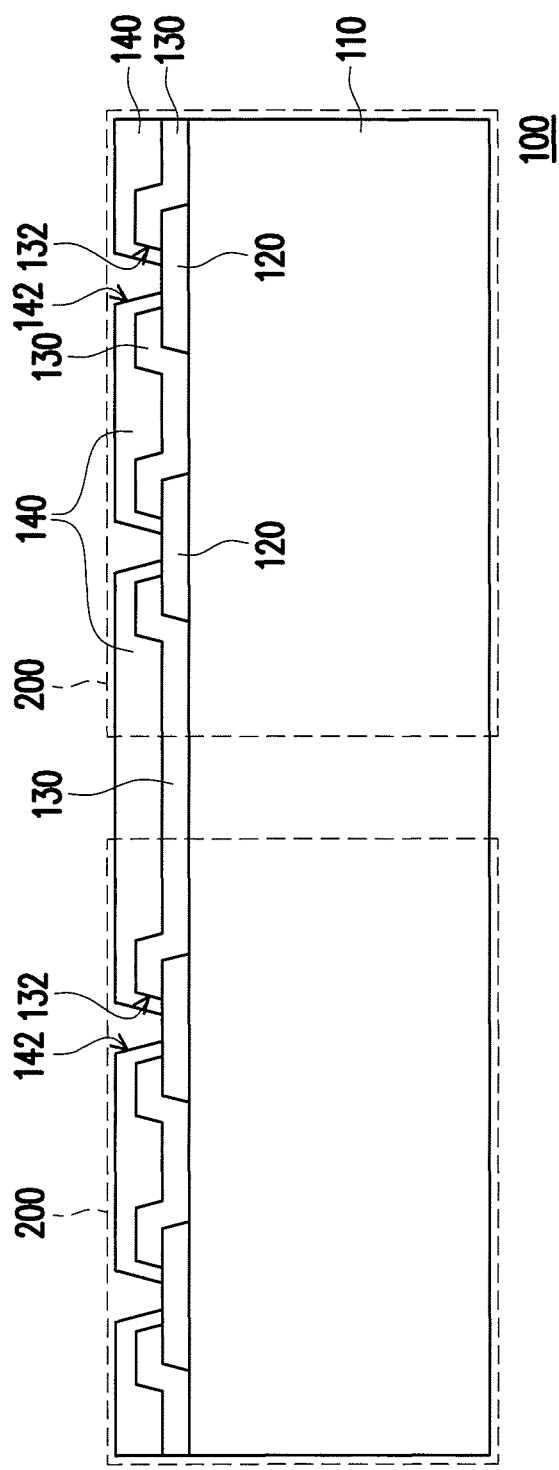
FIGS. 1 through 11 illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 10:
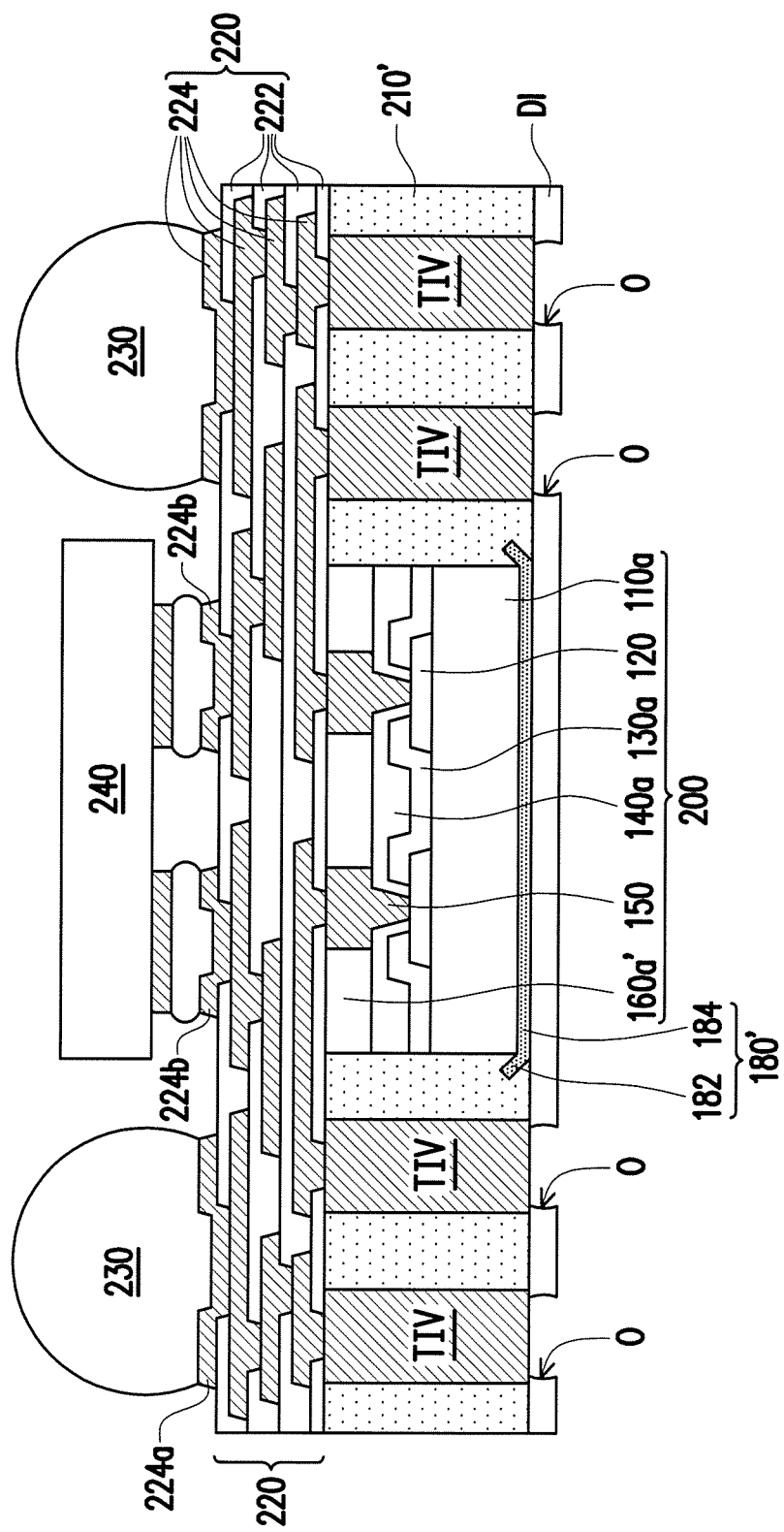
Figure 11:
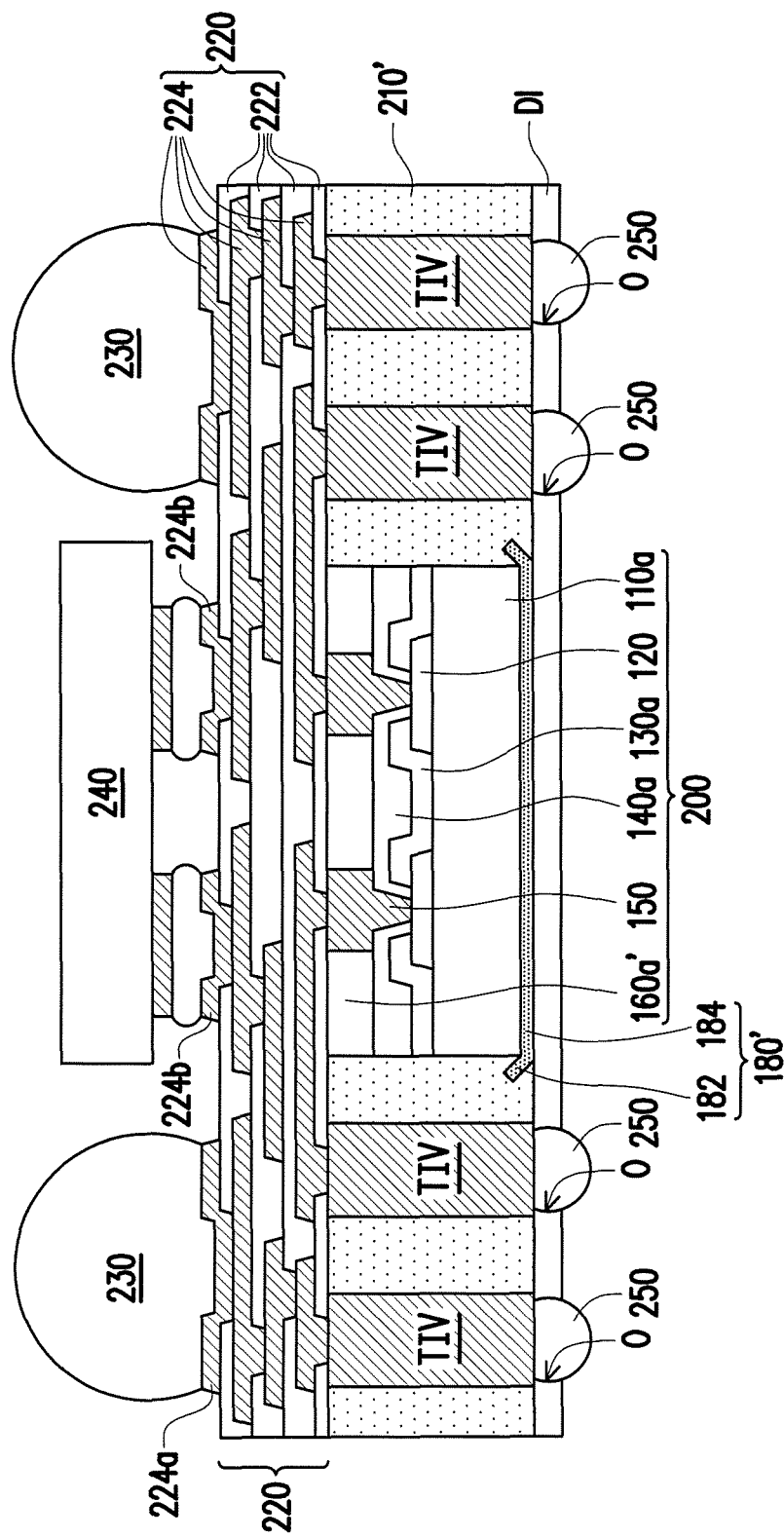
Figure 12:
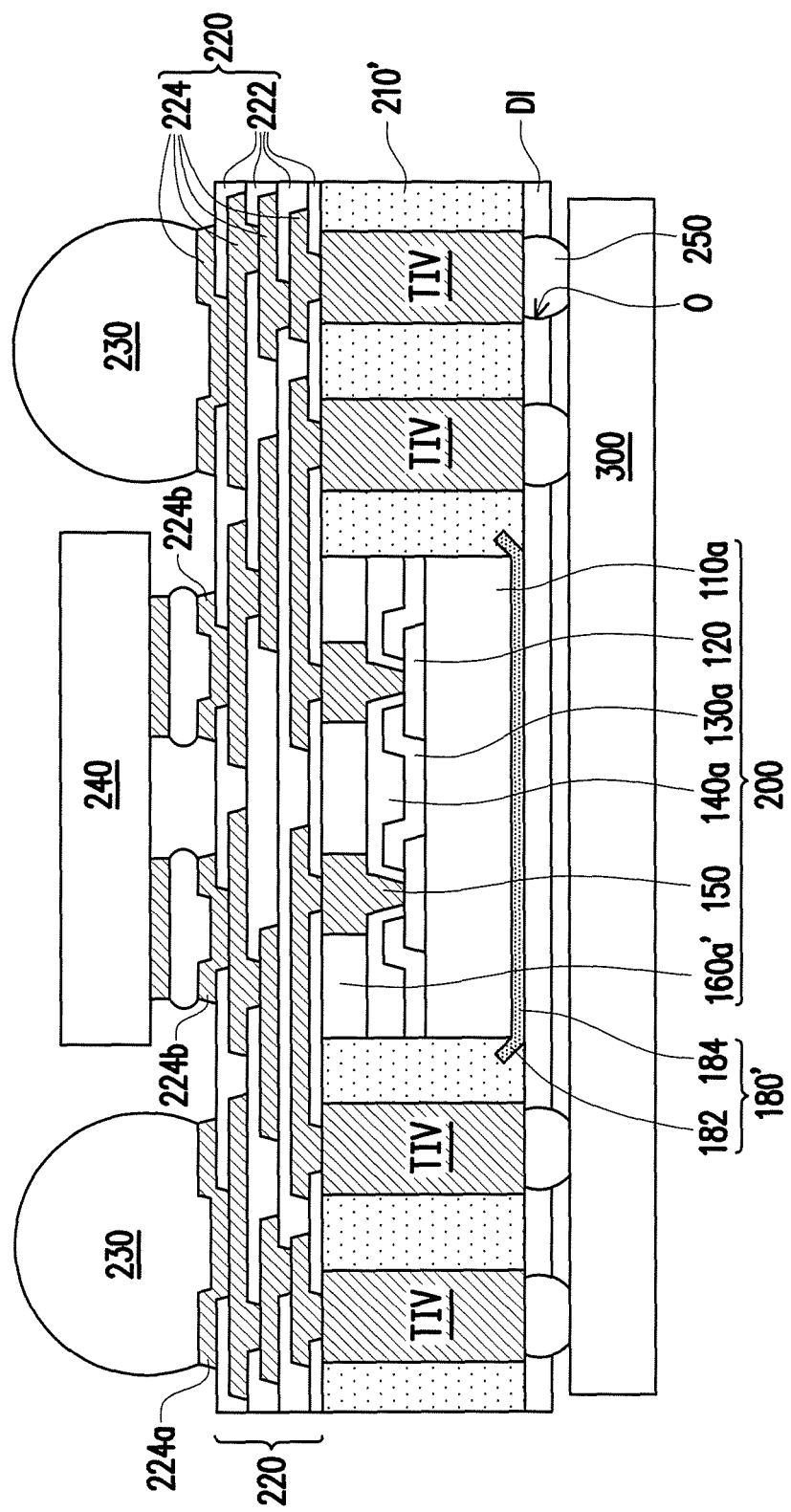
FIG. 12 is a cross-sectional view illustrating a package-on-package (POP) structure in accordance with some embodiments.

FIGS. 1 through 11 illustrate a process flow for fabricating an integrated fan-out package in accordance with some embodiments, and FIG. 12 is a cross-sectional view illustrating a package-on-package (POP) structure in accordance with some embodiments.

Referring to FIG. 1, a wafer 100 including a plurality of dies (or integrated circuit components) 200 arranged in an array is provided. Before a wafer dicing process is performed on the wafer 100, the integrated circuit components 200 of the wafer 100 are connected to one another. In some embodiments, the wafer 100 includes a semiconductor substrate 110, a plurality of conductive pads 120 formed over the semiconductor substrate 110, and a passivation layer 130. The passivation layer 130 is formed over the semiconductor substrate 110 and defines a plurality of contact opening 132 so as to partially expose the conductive pads 120. The conductive pads 120 on the semiconductor substrate 110 are partially exposed from the passivation layer 130 through the contact openings 132. The semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the wafer 100 may further include a post-passivation layer 140 formed over the passivation layer 130. The post-passivation layer 140 covers the passivation layer 130 and has a plurality of contact opening 142. The conductive pads 120 is partially covered by the post passivation layer 140 yet exposed from the contact opening 132. In other words, the conductive pads 120 are partially exposed by the contact opening 142 of the post passivation layer 140. The post-passivation layer 140 may be a polyimide (PI) layer, a polybenzoxazole (PBO) layer, or a dielectric layer formed by other suitable polymers.

Figure 2:
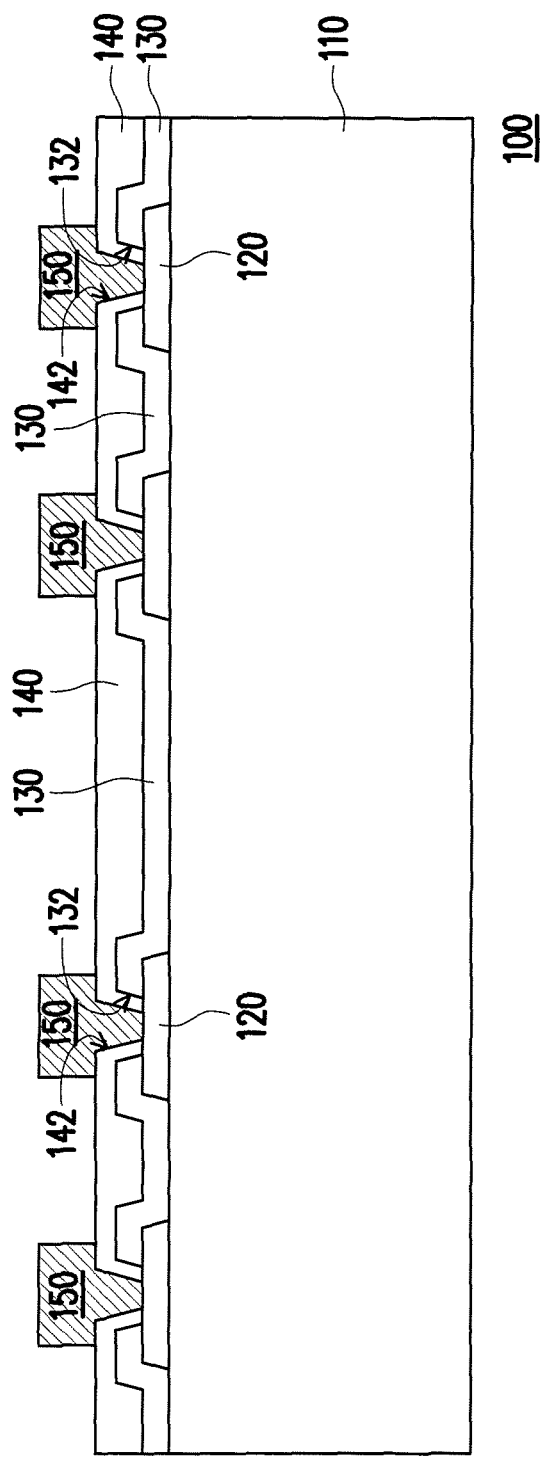

Referring to FIG. 2, a plurality of conductive pillars or conductive vias 150 are formed on the conductive pads 120. In some embodiments, the conductive pillars or conductive vias 150 are plated on the conductive pads 120. For example, a seed layer (e.g., Ti/Cu seed layer) is first sputtered onto the post-passivation layer 140 and the conductive pads 120 exposed by the contact opening 142; a patterned photoresist layer (not shown) for exposing the conductive pads 120 is then formed over the seed layer by photolithography; the wafer 100 including the patterned photoresist layer formed thereon is then immersed into a plating solution such that the conductive pillars or conductive vias 150 are plated on the seed layer that is corresponding to the conductive pads 120. After the plated conductive pillars or conductive vias 150 are formed, the patterned photoresist layer is stripped. Thereafter, by using the conductive pillars or conductive vias 150 as a hard mask, portions of the seed layer that are not covered by the conductive pillars or conductive vias 150 are removed through etching until the post passivation layer 140 is exposed, for example. In some embodiments, the conductive pillars or conductive vias 150 are copper pillars or copper vias.

Figure 3:
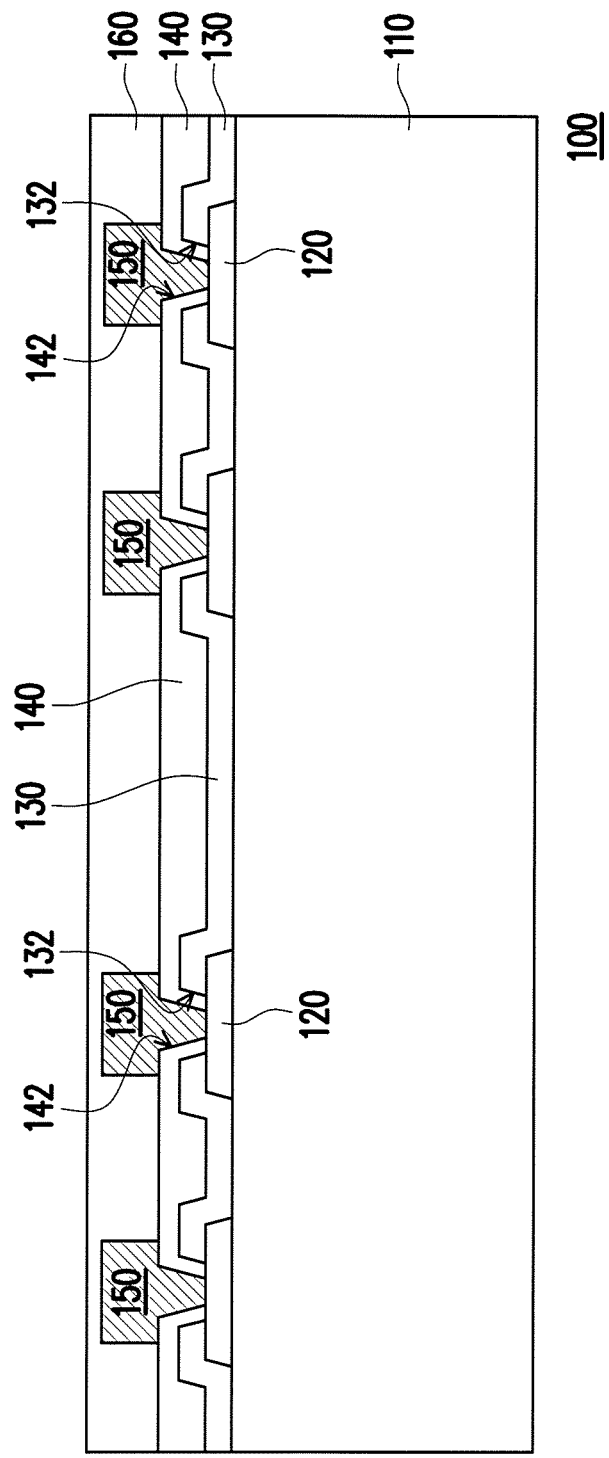

Referring to FIG. 3, after the conductive pillars or conductive vias 150 are formed, a protection layer 160 is formed on the post passivation layer 140 so as to cover the conductive pillars or conductive vias 150. In some embodiments, the protection layer 160 may be a polymer layer having sufficient thickness to encapsulate and protect the conductive pillars or conductive vias 150. For example, the protection layer 160 may be a polybenzoxazole (PBO) layer, a polyimide (PI) layer or other suitable polymers. In some alternative embodiments, the protection layer 160 may be made of inorganic materials.

Figure 4:
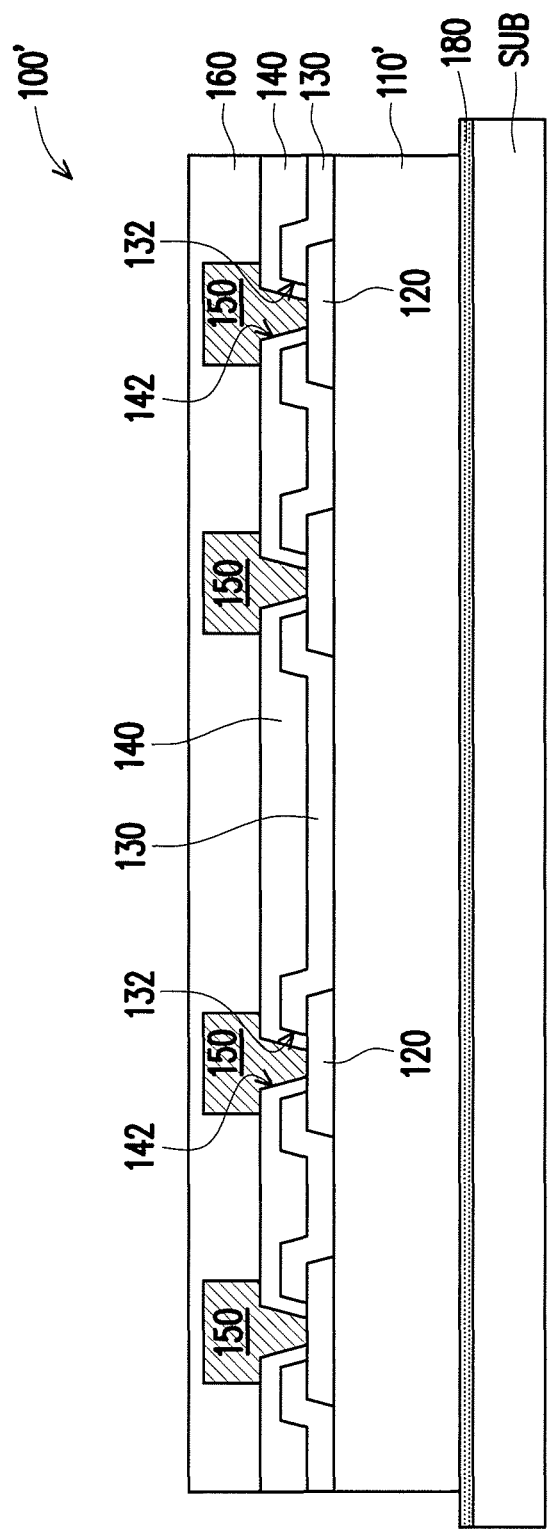

Referring to FIG. 3 and FIG. 4, a back side grinding process is performed on the rear surface of the wafer 100 after the protection layer 160 is formed. During the back side grinding process, the semiconductor substrate 110 is grinded such that a thinned wafer 100' including a semiconductor substrate 110' is formed. Then, the thinned wafer 100' is attached onto a supporting substrate SUB through a die attach film 180. It is noted that the back side grinding process is optional when the thickness of the semiconductor substrate 110 is thin enough. In other words, when the thickness of the semiconductor substrate 110 is acceptable to fabricator, the wafer 100 may be attached onto the supporting substrate SUB through the die attach film 180 and no back side grinding process is required to be performed before the die attaching process.

Figure 5:
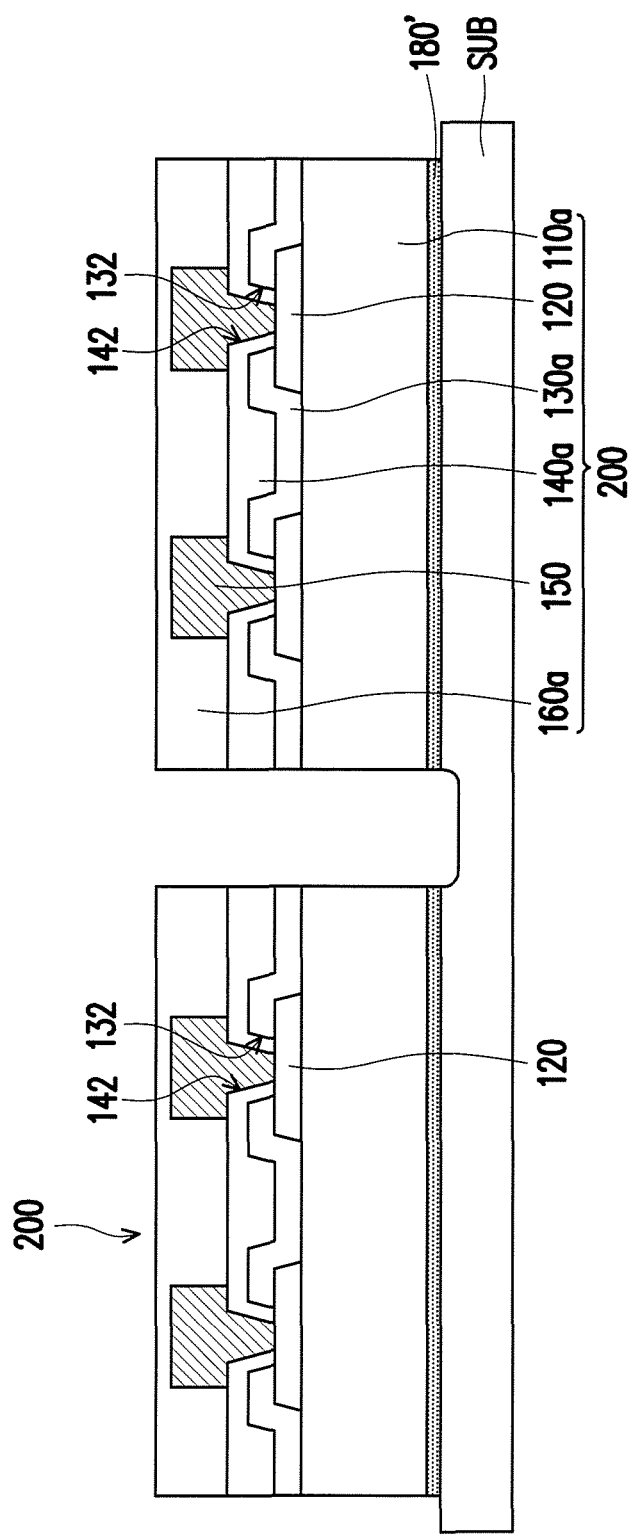

Referring to FIG. 5, after performing the above-mentioned die attaching or die bond process, a wafer dicing process is performed on the thinned wafer 100' (or the wafer 100 shown in FIG. 3) such that the integrated circuit components 200 of the wafer 100' (or the wafer 100 shown in FIG. 3) are singulated from one another. As shown in FIG. 5, the singulated integrated circuit components 200 each includes a semiconductor substrate 110a, the conductive pads 120 formed on the semiconductor substrate 110a, a passivation layer 130a, a post passivation layer 140a, the conductive pillars or conductive vias 150, and a protection layer 160a. The conductive pads 120 and the conductive vias 150 electrically connected thereto may be considered as conductive terminals of the integrated circuit components 200. The materials of the semiconductor substrate 110a, the passivation layer 130a, the post passivation layer 140a, and the protection layer 160a are similar with those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted.

During the wafer dicing process, the die attach film 180 under the thinned wafer 100' is patterned or cut such that a plurality of die attach films 180' are formed under the singulated integrated circuit components 200. It is noted that the sidewalls of the die attach films 180' are substantially aligned with the sidewalls of the integrated circuit components 200.

As shown in FIG. 4 and FIG. 5, during the back side grinding and the wafer dicing processes, the protection layer 160 and 160a may well protect the conductive terminals (e.g., the conductive pads 120 and the conductive vias 150) of the integrated circuit components 200. In addition, the conductive pads 120 and the conductive vias 150 of the integrated circuit components 200 may be protected from being damaged by sequentially performed processes, such as the pick-up and placing process of the integrated circuit components 200, the molding process, and so on.

Figure 6:
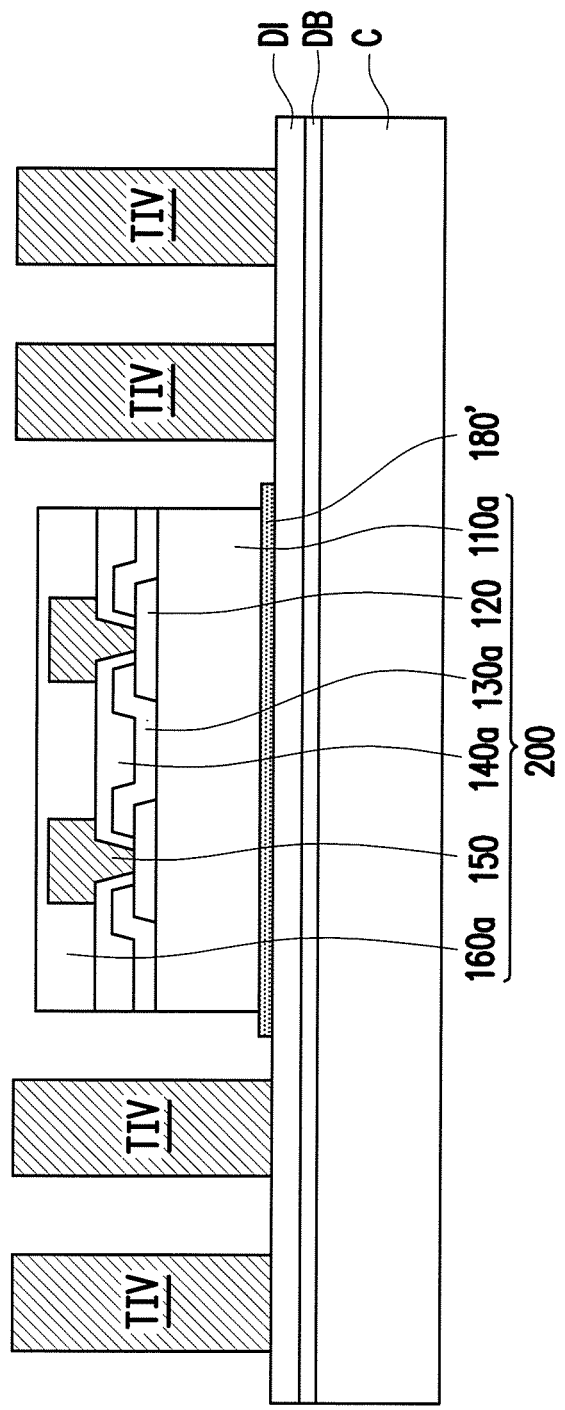

Referring to FIG. 6, after the integrated circuit components 200 and the die attach films 180' are formed, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB.

After the carrier C having the de-bonding layer DB and the dielectric layer DI formed thereon is provided, a plurality of conductive through insulator vias TIV are formed on the dielectric layer DI. In some embodiments, the plurality of conductive through insulator vias TIV is formed by photolithography, plating, and photoresist stripping process. For example, the conductive through insulator vias TIV include copper posts.

As shown in FIG. 5 and FIG. 6, in some embodiments, one of the integrated circuit components 200 including the conductive terminals (e.g. the conductive pads 120 and the conductive vias 150) and a protection layer 160a formed thereon may be picked and placed on the dielectric layer DI. The integrated circuit component 200 is attached (or adhered) on the dielectric layer DI through the die attach film 180'. It is noted that after the integrated circuit component 200 is picked and placed on the dielectric layer DI, the die attach film 180' may expand laterally and the area occupied by the die attach film 180' increases. In other words, the sidewalls of the die attach films 180' are not aligned with the sidewalls of the integrated circuit components 200. The expansion of the die attach film 180' resulted from the pressure applied on the integrated circuit components 200 corresponds to the volume (or thickness) of the die attach film 180' and the force applied on the integrated circuit components 200.

In some alternative embodiments, more than one of the integrated circuit components 200 may be picked and placed on the dielectric layer DI, wherein the integrated circuit components 200 placed on the dielectric layer DI may be arranged in an array. When the integrated circuit components 200 placed on the dielectric layer DI are arranged in an array, the conductive through insulator vias TIV may be classified into groups. The number of the integrated circuit components 200 may correspond to the number of the groups of the conductive through insulator vias TIV.

As shown in FIG. 6, in the illustrated embodiment, the top surface of the protection layer 160a is lower than the top surfaces of the conductive through insulator vias TIV, and the top surface of the protection layer 160a is higher than the top surfaces of the conductive pillars or conductive vias 150. However, the disclosure is not limited thereto. In some alternative embodiments, the top surface of the protection layer 160a may be substantially aligned with the top surfaces of the conductive through insulator vias TIV, and the top surface of the protection layer 160a is higher than the top surfaces of the conductive pillars or conductive vias 150.

As shown in FIG. 6, one or more of the integrated circuit components 200 may be picked and placed on the dielectric layer DI after the formation of the conductive through insulator vias TIV. However, the disclosure is not limited thereto. In some alternative embodiments, one or more of the integrated circuit components 200 may be picked and placed on the dielectric layer DI before the formation of the conductive through insulator vias TIV.

Figure 7:
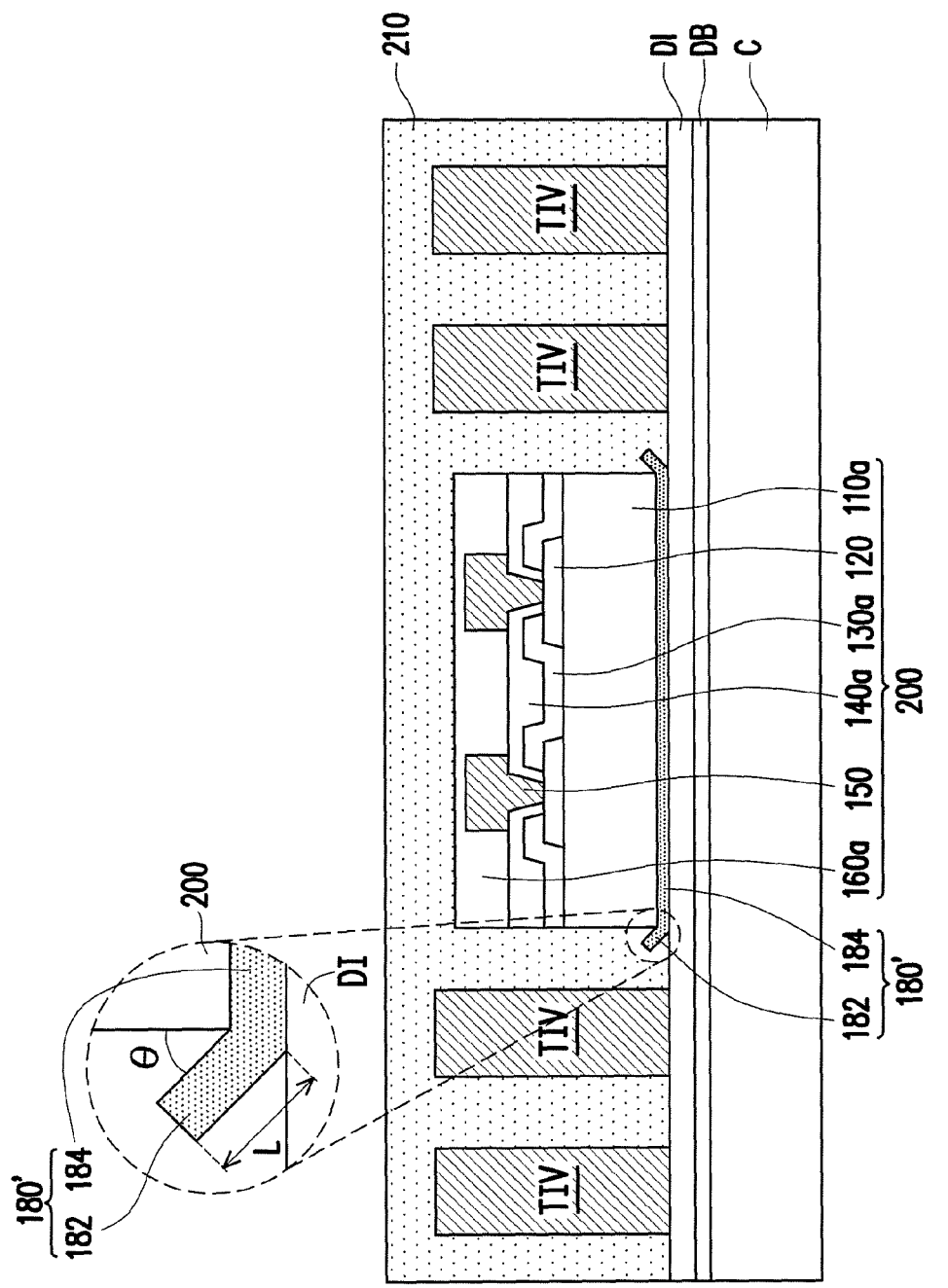

Referring to FIG. 7, an insulating material 210 is formed on the dielectric layer DI through, for example, a compression molding process so as to encapsulate the integrated circuit component 200, the die attach film 180', and the conductive through insulator vias TIV. The conductive pillars or conductive vias 150 and the protection layer 160a of the integrated circuit component 200 are encapsulated by and well protected by the insulating material 210. In other words, the conductive pillars or conductive vias 150 and the protection layer 160a of the integrated circuit component 200 are not revealed and are well protected by the insulating material 210. In some embodiments, the insulating material 210 includes epoxy or other suitable resins.

As shown in FIG. 7, during the compression molding process, an uplifted edge 182 is formed from the laterally protruding portion of the die attach film 180', which raises/folded toward sidewalls of the integrated circuit component 200. The uplifted edge 182 of the die attach film 180' and the integrated circuit component 200 are encapsulated by the insulating material 210 after the compression molding process is performed. Accordingly, the die attach film 180' may include a die attach portion 184 and an extended portion 182 (i.e. the uplifted edge 182) connected to the die attach portion 184, wherein the integrated circuit component 200 are directly mounted on the die attach portion 184, and the extended portion 182 (i.e. the uplifted edge 182) extends upwardly and outwardly from the edge of the die attach portion 184. The extended portion 182 (i.e. the uplifted edge 182) may be a frame connected to the die attach portion 184.

It is noted that the molding compound used in the compression molding process lifts the extended portion 182 (i.e. the uplifted edge 182) of the die attach film 180' to delaminate from the dielectric layer DI on the carrier C such that the extended portion 182 (i.e. the uplifted edge 182) may raise toward the sidewalls of the integrated circuit component 200. A space is generated between the extended portion 182 (i.e. the uplifted edge 182) and the sidewalls of the integrated circuit component 200, and the space is filled by the insulating material 210. In some embodiments, the extended portion 182 (i.e. the uplifted edge 182) is lifted by the molding compound, the included angle θ between the extended portion 182 (i.e. the uplifted edge 182) and the sidewalls of the integrated circuit component 200 ranges from about 0 degree to about 70 degree, and the length L of the extended portion 182 (i.e. the uplifted edge 182) ranges from about 10 micrometers to about 20 micrometers, for example. In some embodiments, the extended portion 182 (i.e. the uplifted edge 182) of the die attach film 180' may increase the contact area and enhance the adhesion between the die attach film 180' and the insulating material 210 such that the possibility of the delamination between the die attach film 180' and the insulating material 210 can be reduced. The angle θ of the die attach film 180' is relevant to the pressure distribution of the compression molding process. In other words, the angle θ of the die attach film 180' is a pressure distribution index of the compression molding process.

The included angle θ between the extended portion 182 (i.e. the uplifted edge 182) and the sidewalls of the integrated circuit component 200 is relevant to the parameters (e.g. the pressure, the shape of the mold used to form the insulating material 210, and so on) of the compression molding process. Furthermore, the length L of the extended portion 182 (i.e. the uplifted edge 182) is relevant to the pressing force applied on the integrated circuit component 200 during the pick-up and placing process. In other words, the length L of the extended portion 182 (i.e. the uplifted edge 182) is relevant to the lateral expansion resulted from the above-mentioned pressing force.

Figure 13:
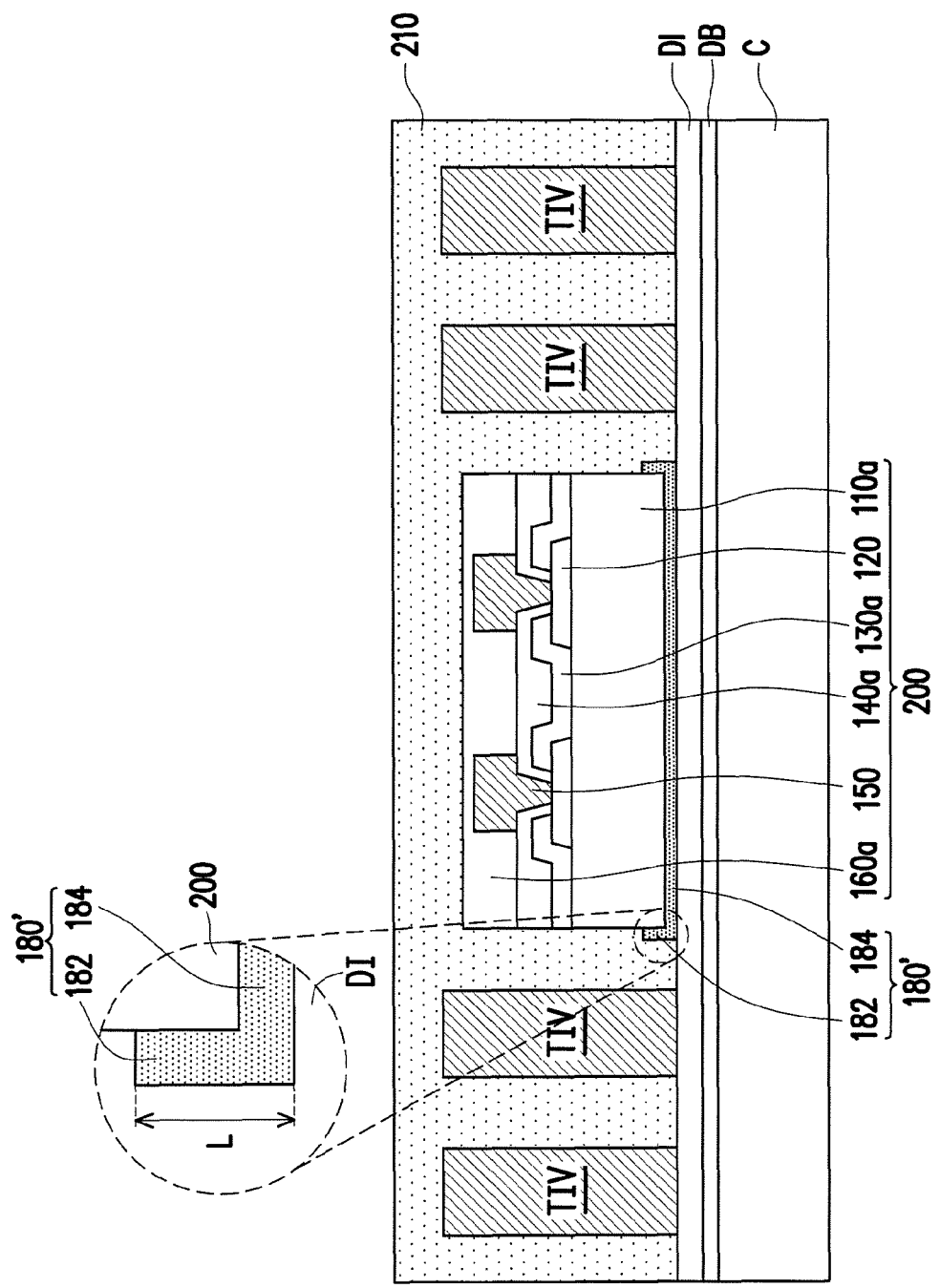
FIG. 13 is an enlarged a cross-sectional view illustrating the uplifted edge of the die attach film in accordance with some embodiments.

In some alternative embodiments, the extended portion 182 (i.e. the uplifted edge 182) of the die attach film 180' may extend along and may be in contact with the sidewalls of the integrated circuit component 200, as shown in FIG. 13. In other words, there is almost no space between the extended portion 182 (i.e. the uplifted edge 182) and the sidewalls of the integrated circuit component 200.

Figure 8:
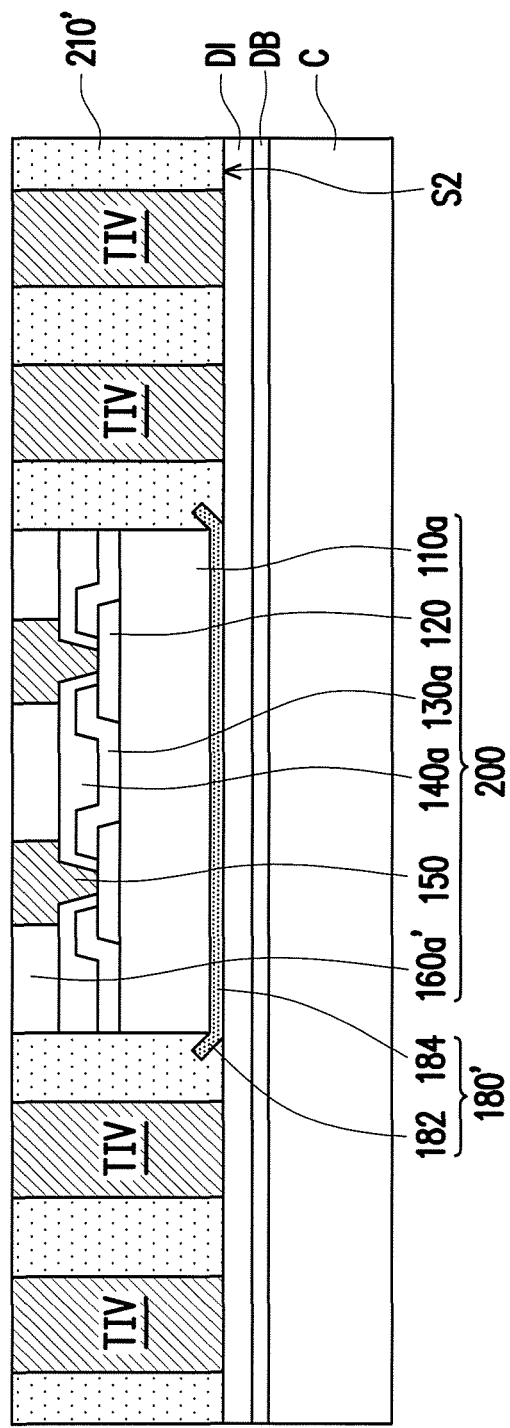

Referring to FIG. 8, the insulating material 210 is grinded until the top surfaces of the conductive pillars or conductive vias 150 (i.e. conductive terminals), the top surfaces of the conductive through insulator vias TIV, and the top surface of the protection layer 160a are exposed so as to form an insulating encapsulation 210'. In some embodiments, the insulating material 210 is grinded by a mechanical grinding process and/or a chemical mechanical polishing (CMP) process. During the grinding process of the insulating material 210, portions of the protection layer 160a are grinded to form a protection layer 160a'. In some embodiments, during the mechanical grinding process of the insulating material 210 and the protection layer 160a, portions of the conductive through insulator vias TIV are grinded also.

As shown in FIG. 8, the insulating encapsulation 210' laterally encapsulates the extended portion 182 (i.e. the uplifted edge 182) of the die attach film 180' and the integrated circuit component 200, and the insulating encapsulation 210' is penetrated by the conductive through insulator vias TIV. In other words, the integrated circuit component 200, the die attach film 180', and the conductive through insulator vias TIV are embedded in the insulating encapsulation 210'.

Figure 9:
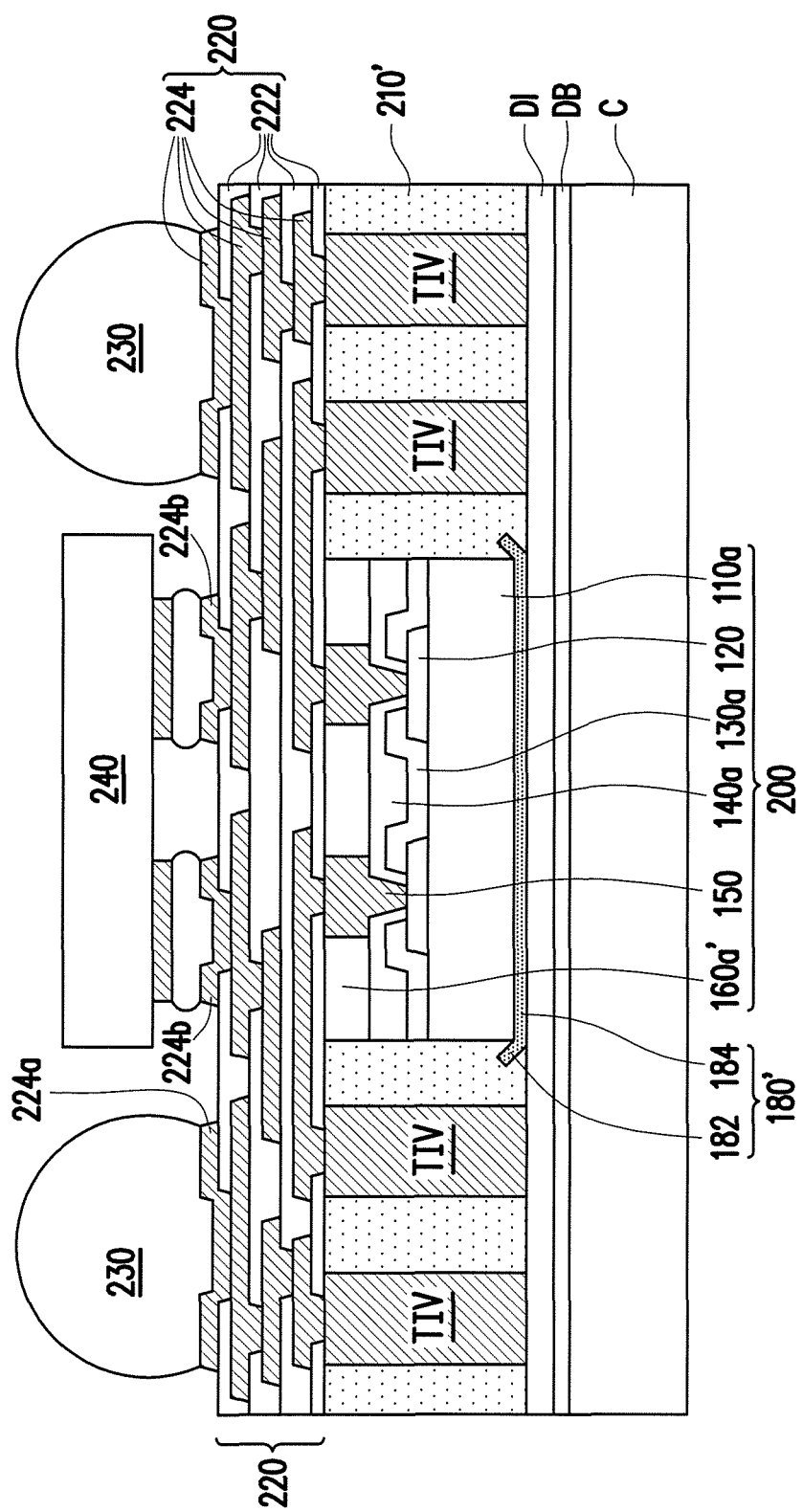

Referring to FIG. 9, after the insulating encapsulation 210' and the protection layer 160a' are formed, a redistribution circuit structure 220 electrically connected to the conductive pillars or conductive vias 150 of the integrated circuit component 200 is formed on the top surfaces of the conductive through insulator vias TIV, the top surface of the insulating encapsulation 210', the top surfaces of the conductive vias 150 and the top surface of the protection layer 160a'. The redistribution circuit structure 220 is fabricated to electrically connect with one or more conductive terminals underneath. The redistribution circuit structure 220 is described in accompany with FIG. 9 in detail.

Referring to FIG. 9, the redistribution circuit structure 220 includes a plurality of inter-dielectric layers 222 and a plurality of redistribution conductive layers 224 stacked alternately, and the redistribution conductive layers 224 are electrically connected to the conductive vias 150 of the integrated circuit component 200 and the conductive through insulator vias TIV embedded in the insulating encapsulation 210'. As shown in FIG. 9, in some embodiments, the top surfaces of the conductive vias 150 and the top surfaces of the conductive through insulator vias TIV are in contact with the redistribution circuit structure 220. The top surfaces of the conductive vias 150 and the top surfaces of the conductive through insulator vias TIV are partially covered by the bottommost inter-dielectric layer 222. Furthermore, the topmost redistribution conductive layer 224 includes a plurality of pads. In some embodiment the above-mentioned pads include a plurality of under-ball metallurgy (UBM) patterns 224a for ball mount and/or at least one connection pads 224b for mounting of passive components. The number of the under-ball metallurgy patterns 224a and the connection pad 224b is not limited in this disclosure.

As shown in FIG. 9, after the redistribution circuit structure 220 is formed, a plurality of conductive balls 230 are placed on the under-ball metallurgy patterns 224a, and a plurality of passive components 240 are mounted on the connection pads 224b. In some embodiments, the conductive balls 230 may be placed on the under-ball metallurgy patterns 224a by a ball placement process and the passive components 240 may be mounted on the connection pads 224b through a soldering process.

Referring to FIG. 9 and FIG. 10, after the conductive balls 230 and the passive components 240 are mounted on the redistribution circuit structure 220, the dielectric layer DI formed on the top surface of the insulating encapsulation 210' is de-bonded from the de-bonding layer DB such the dielectric layer DI is separated from the carrier C. In some embodiments, the de-bonding layer DB (e.g., the LTHC release layer) may be irradiated by an UV laser such that the dielectric layer DI is peeled from the carrier C. As shown in FIG. 10, the dielectric layer DI is then patterned such that a plurality of contact openings O is formed to expose the bottom surfaces of the conductive through insulator vias TIV. The number of the contact openings O is corresponding to the number of the conductive through insulator vias TIV. In some embodiments, the contact openings O of the dielectric layer DI is formed by laser drilling process.

Referring to FIG. 11, after the contact openings O is formed in the dielectric layer DI, a plurality of conductive balls 250 are placed on the bottom surfaces of the conductive through insulator vias TIV that are exposed by the contact openings O. And, the conductive balls 250 are, for example, reflowed to bond with the bottom surfaces of the conductive through insulator vias TIV. As shown in FIG. 11, after the conductive balls 230 and the conductive balls 250 are formed, an integrated fan-out package of the integrated circuit component 200 having dual-side terminals is accomplished.

Referring to FIG. 12, another package 300 is then provided. In some embodiments, the package 300 is, for example, a memory device. The package 300 is stacked over and is electrically connected to the integrated fan-out package illustrated in FIG. 11 through the conductive balls 250 such that a package-on-package (POP) structure is fabricated.

In the above-mentioned embodiments, reliability and yield rate of the integrated fan-out package in the present application are improved by the die attach film having the extended portion or the uplifted edge.

In accordance with some embodiments of the present disclosure, an integrated fan-out package including a die attach film, an integrated circuit component, an insulating encapsulation, and a redistribution circuit structure is provided. The integrated circuit component is disposed on the die attach film and includes a plurality of conductive terminals. The die attach film includes an uplifted edge which extends protrudingly from under a periphery portion of the integrated circuit component and raises toward sidewalls thereof. The insulating encapsulation encapsulates the uplifted edge and the integrated circuit component. The redistribution circuit structure is disposed on the integrated circuit component and the insulating encapsulation, and the redistribution circuit structure is electrically connected to the conductive terminals of the integrated circuit component.

In accordance with alternative embodiments of the present disclosure, an integrated fan-out package including a die attach film, an integrated circuit component, an insulating encapsulation, and a redistribution circuit structure is provided. The integrated circuit component includes a plurality of conductive terminals. The die attach film is adhesively attached to a bottom surface of the integrated circuit component, The die attach film includes a die attach portion in contact with the integrated circuit component and an extended portion connected to the die attach portion, the extended portion extending upwardly and outwardly from the die attach portion. The insulating encapsulation laterally encapsulates the die attach film and the integrated circuit component. The redistribution circuit structure is disposed on the integrated circuit component and the insulating encapsulation, and the redistribution circuit structure is electrically connected to the conductive terminals of the integrated circuit component.

In accordance with yet alternative embodiments of the present disclosure, a method of fabricating an integrated fan-out package is provided. The method includes the following steps. An integrated circuit component including a plurality of conductive terminals is provided and mounted onto a carrier through a die attach film. An insulating encapsulation is formed on the carrier through a compression molding process, wherein the insulating encapsulation laterally encapsulates the integrated circuit component and the die attach film, an uplifted edge of the die attach film is formed during the compression molding process, and the uplifted edge raises toward sidewalls of the integrated circuit component. A redistribution circuit structure is formed on the integrated circuit component and the insulating encapsulation, and the redistribution circuit structure is electrically connected to the conductive terminals of the integrated circuit component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated fan-out package, the method comprising:
   providing an integrated circuit component comprising a plurality of conductive terminals;
   mounting the integrated circuit component onto a carrier through a die attach film;
   forming an insulating encapsulation on the carrier through a compression molding process, the insulating encapsulation laterally encapsulating the integrated circuit component and the die attach film, an uplifted edge of the die attach film being formed during the compression molding process, and the uplifted edge raising toward sidewalls of the integrated circuit component; and
   forming a redistribution circuit structure on the integrated circuit component and the insulating encapsulation, the redistribution circuit structure being electrically connected to the conductive terminals of the integrated circuit component.

2. The method of claim 1, wherein the compression molding process lifts the uplifted edge of the die attach film to delaminate from the carrier and raise toward the sidewalls of the integrated circuit component.

3. The method of claim 1, wherein the compression molding process causes the uplifted edge of the die attach film to extend along the sidewalls of the integrated circuit component.

4. The method of claim 1, wherein the compression molding process causes the uplifted edge of the die attach film to raise toward the sidewalls of the integrated circuit component, and the space between the uplifted edge and the sidewalls of the integrated circuit component is filled by the insulating encapsulation.

5. The method of claim 1, wherein the compression molding process causes the uplifted edge of the die attach film to raise toward the sidewalls of the integrated circuit component, and an included angle between the uplifted edge and the sidewalls of the integrated circuit component ranges from about 0 degree to about 70 degree.

6. The method of claim 1 further comprising: forming a plurality of conductive through insulator vias on the carrier before forming the insulating encapsulation, wherein the conductive through insulator vias are electrically connected to the redistribution circuit structure after forming the conductive through insulator vias and the redistribution circuit structure.

\* \* \* \* \*